United States Patent
Aebersold

(10) Patent No.: US 9,666,049 B2
(45) Date of Patent: May 30, 2017

(54) SMOKE DETECTION UNIT WITH LIGHT-EMITTING DIODE AND PHOTO-DETECTOR, AND WITH AN LED CHIP ARRANGED IN THE LIGHT-EMITTING DIODE AND WITH A PHOTOSENSOR FOR DETERMINING A DEGREE OF AGING AND/OR A COMPENSATION VALUE FOR A LIGHT CURRENT, AS WELL AS A LIGHT-EMITTING DIODE

(71) Applicant: Siemens Schweiz AG, Zurich (CH)

(72) Inventor: Hans Aebersold, Bonstetten (CH)

(73) Assignee: SIEMENS SCHWEIZ AG, Zurich (CH)

( * ) Notice: Subject to any disclaimer, the term of this patent is extended or adjusted under 35 U.S.C. 154(b) by 0 days.

(21) Appl. No.: 15/236,556

(22) Filed: Aug. 15, 2016

(65) Prior Publication Data

US 2017/0046936 A1   Feb. 16, 2017

(30) Foreign Application Priority Data

Aug. 13, 2015   (EP) ..................................... 15180933

(51) Int. Cl.
*G08B 17/10*   (2006.01)
*G08B 17/107*   (2006.01)

(52) U.S. Cl.
CPC .................................. *G08B 17/107* (2013.01)

(58) Field of Classification Search
CPC ..... G08B 17/10; G08B 17/103; G08B 17/107
See application file for complete search history.

(56) References Cited

U.S. PATENT DOCUMENTS

| 4,851,819 A * | 7/1989 | Kawai .................. G08B 17/113 250/574 |
| 5,872,634 A | 2/1999 | Kunz ............................ 356/438 |

(Continued)

FOREIGN PATENT DOCUMENTS

| EP | 0886252 A1 | 12/1998 | ........... G08B 17/103 |
| EP | 1324396 A1 | 7/2003 | ............... G11B 7/12 |

(Continued)

OTHER PUBLICATIONS

European Search Report, Application No. 15180933.2, 14 pages, Jun. 29, 2016.

*Primary Examiner* — Curtis Odom
(74) *Attorney, Agent, or Firm* — Slayden Grubert Beard PLLC

(57) ABSTRACT

An optical smoke detection unit for a danger alarm includes a light-emitting diode (LED) including at least one LED chip in an LED housing and connection contacts contacting the LED chip and running out of the LED housing. The smoke detection unit may include a photo-detector spectrally sensitive to emitted light for detecting smoke and a control unit for controlling the LED and for evaluating a sensor signal of the photo-detector for characteristic fire magnitudes. The LED may include a photosensor spectrally sensitive to the emitted light. The control unit may detect an electrical characteristic magnitude of the photosensor while providing electrical control of the LED, and based on the detected electrical characteristic magnitude, (a) derive and output ageing information about the LED and/or (b) determine a reduction of light current of the LED and modify the electrical control of LED to correct such reduction.

15 Claims, 3 Drawing Sheets

(56) References Cited

U.S. PATENT DOCUMENTS

2006/0192084 A1  8/2006  Lee et al. .................. 250/214.1
2010/0109022 A1  5/2010  Kim .............................. 257/84
2010/0328085 A1  12/2010  Bohanon ...................... 340/630

FOREIGN PATENT DOCUMENTS

| EP | 2238621 B1 | 10/2015 | ............. H01L 25/16 |
|----|------------|---------|--------------------------|
| GB | 1313877 A | 4/1973 | ............. G01N 21/27 |
| WO | 93/06462 A1 | 4/1993 | ........... G08B 17/107 |

* cited by examiner

SMOKE DETECTION UNIT WITH LIGHT-EMITTING DIODE AND PHOTO-DETECTOR, AND WITH AN LED CHIP ARRANGED IN THE LIGHT-EMITTING DIODE AND WITH A PHOTOSENSOR FOR DETERMINING A DEGREE OF AGING AND/OR A COMPENSATION VALUE FOR A LIGHT CURRENT, AS WELL AS A LIGHT-EMITTING DIODE

CROSS-REFERENCE TO RELATED APPLICATIONS

This application claims priority to DE Application No. 10 2014 225 810.3 filed Dec. 15, 2014, the contents of which are hereby incorporated by reference in their entirety.

TECHNICAL FIELD

The invention relates to an optical smoke detection unit for a danger alarm, in particular for a smoke alarm. The smoke detection unit comprises at least one light-emitting diode for emitting light. The light-emitting diode is a one-piece structural unit and comprises a light-emitting diode housing with a light-emitting diode chip arranged in it and connection contacts contacting the light-emitting diode chip and running out of the light-emitting diode housing. In addition, the smoke detection unit comprises a photodetector sensitive at least spectrally to emitted light for the detection of smoke, such as, e.g. a photodiode, and comprises a control unit connected to the light-emitting diode and to the photodetector. The control unit is typically a microcontroller. It is provided at least for the electrical control of the light-emitting diode (for illumination) and for evaluating a sensor signal upon characteristic fire magnitudes which is outputted by the photodetector. The particular processing steps for the controlling in time of the two LED chips and the synchronized detection and evaluation of the particular photosensor signal can be realized by suitable programs steps which can be carried out on the microcontroller. The light-emitting diode, the photodetector and the microcontroller are preferably arranged on a circuit carrier and are wired to each other.

BACKGROUND

Conventional smoke detection units -can be part of a scattered light smoke alarm in a closed or open construction. In a closed construction such a scattered light smoke alarm comprises an optical measuring chamber which is permeable for smoke to be detected but is screened against direct environmental light. Such a measuring chamber is often also designated as a labyrinth. On the other hand, scattered light smoke alarms of with an open construction comprise a detection chamber located outside of the alarm housing in the open. Finally, such smoke detection units can be part of an extinction smoke alarm in which the attenuation of light by present smoke is detected and evaluated by the photo-detector.

It is known that light-emitting diodes age during operation and in the course of time have a reduced light performance. In contrast to the above, photosensors such as, e.g., photodiodes have comparatively small, negligible aging phenomena. Consequently, the light performance is to be monitored in order to emit a warning notice in case of a light performance which is too low for the detection of smoke. Alternatively, the control performance or the pulse duration for the control of the light-emitting diode can be increased in order to correct the reduced light performance and/or the reduced emitted light current. To this end the use of a separate photosensor is known which preferably receives direct light from the light-emitting diode and is arranged opposite the light-emitting diode. The outputting of the warning alarm then takes place as a function of the photo-detector signal and/or a light performance compensation takes place via the path of the electrical control of the light-emitting diode.

Furthermore, it is known that all optoelectronic structural elements in the smoke detection unit become contaminated in time. That means that the optical sending power of the light-emitting diode and the optical detection sensitivity of the photodetector for the detection of smoke and of the separate photodetector for the monitoring of the light performance and/or light current decrease as the contamination increases and independently of the ageing of these optoelectronic structural elements.

Finally, light-emitting diodes, in particular one-, two- or multi-color light-emitting diodes are known from the prior art which are one-piece structural elements. Such light-emitting diodes comprise a LED housing, at least one LED chip arranged in it for the particular "color" and comprise the connection contacts contacting the particular LED chip and running out of the LED housing.

SUMMARY

One embodiment provides an optical smoke detection unit for a danger alarm, e.g., for a smoke alarm which comprises at least: a light-emitting diode for emitting light, wherein the light-emitting diode comprises an LED housing with an LED chip arranged in it and comprises connection contacts contacting the LED chip and run out of the LED housing; a photo-detector spectrally sensitive to emitted light for the detection of smoke; a control unit connected to the light-emitting diode and to the photo-detector for the electrical control of the light-emitting diode and for the evaluation of a sensor signal is emitted by the photo-detector for characteristic fire magnitudes; wherein the light-emitting diode comprises a photosensor spectrally sensitive to the emitted light and arranged in the LED housing; and wherein the control unit is arranged in such a manner that during the electrical control of the light-emitting diode it simultaneously detects a characteristic electrical magnitude of the photosensor in order to derive ageing information about the light-emitting diode and to output it and/or to determine a reduction of the light current of the light-emitting diode and to correct it by an modified electrical control of the light-emitting diode.

In one embodiment, the photosensor is a photodiode spectrally sensitive to the emitted light, in particular a PIN photodiode.

In one embodiment, the photosensor comprises an integrated, electronic measurement amplification circuit.

In one embodiment, the light-emitting diode comprises two preferably type-identical LED chips, wherein a first one of the two LED chips is provided for emitting a one-color light while the other, second LED chip is provided for operating as a photodiode, wherein the control unit is arranged for electrically controlling the first LED chip and at the same time for detecting the light stream flowing through the second LED chip or for detecting a light voltage generated by the second LED chip in order to derive the ageing information of the first LED chip and to emit it, and/or in order to determine the reduction of the light current of the first LED chip and to correct it by a modified electrical control of the first LED chip.

In one embodiment, the light-emitting diode is a two-color light-emitting diode, wherein the two-color light-emitting diode comprises a first and a second LED chip for emitting light in a first and in a second wavelength range different from the first one, wherein the control unit is arranged for electrically controlling one of the LED chips and to switch the other LED chip into an operating mode like a photodiode, and wherein the control unit is arranged for detecting the light current flowing through the other LED chip or a light voltage generated by the other LED chip as a characteristic electrical magnitude in order to derive the ageing information of the particular controlled LED chip and to emit it and/or in order to determine the reduction of the light current of the particular controlled LED chip and to correct it by a modified electrical control of the particular controlled LED chip.

In one embodiment, the two LED chips are arranged adjacent to one another on a chip carrier of the light-emitting diode, wherein one edge of an LED chip is located opposite an edge of the other LED chip so that laterally emitted edge light of an LED chip is coupled optically laterally into the other LED chip.

In one embodiment, the light-emitting diode is a two-color light-emitting diode, wherein the two-color light-emitting diode comprises a first and a second LED chip for emitting light in a first wavelength and in a second wavelength different from the first one, wherein the photosensor is a photodiode spectrally sensitive to the emitted light, in particular a PIN photodiode, and wherein the control unit is arranged to selectively control one of the LED chips electrically and at the same time to detect the light stream flowing through the photodiode or to detect a light voltage generated on the photodiode as a characteristic electrical magnitude in order to derive the ageing information of the particular controlled LED chip and to emit it and/or in order to determine the reduction of the light current of the particular controlled LED chip and to correct it by a modified electrical control of the particular controlled LED chip.

In one embodiment, the LED housing forms such an optical boundary surface on its outside for the ambient air that a part of the light emitted from an LED chip is reflected to the photosensor respectively to the other LED chip.

In one embodiment, the LED housing is manufactured from a plastic transparent for the light to be emitted and wherein the LED housing has such optical properties and/or optical structures that a part of the light emitted from an LED chip is reflected to the photosensor respectively to the other LED chip.

In one embodiment, the smoke detection unit comprises a diaphragm arranged downstream of the light-emitting diode and/or comprises a backscatter object connected in optically downstream so that a part of the emitted light is reflected back in the direction of the light-emitting diode in order to illuminate the particular LED chip.

In one embodiment, at least one of the LED chips is constructed for emitting light with a wavelength in the range of 665 nm to 1000 nm and/or for emitting light with a wavelength in the range of 350 nm to 500 nm.

In one embodiment, the light-emitting diode has a standard plastic housing with a 3 mm or 5 mm diameter or wherein the light-emitting diode is an SMD component for the surface mounting on a circuit carrier.

Another embodiment provides a scattered light smoke alarm comprising an alarm housing and an optical measuring chamber received in it with at least one opening for the possible passage of smoke to be detected, wherein a smoke detection unit as disclosed above is received in the measuring chamber and is screened against ambient light, wherein the photo-detector is arranged with at least one light-emitting diode in a forward- and/or a backscatter light arrangement, and wherein the control unit is arranged to emitting a fire alarm if the signal emitted by the photo-detector exceeds a minimum scattered light level.

Another embodiment provides an open scattered light smoke alarm with the smoke detection unit as disclosed above, wherein the smoke detection unit is arranged in an alarm housing of the open scattered light smoke alarm, wherein a detection chamber provided for the detection of scattered light is located outside of the alarm housing, and wherein the control unit is arranged to emit a fire alarm if the sensor signal emitted by the photo-detector exceeds a minimum scattered light level.

Another embodiment provides an extinction smoke alarm with an alarm housing with at least one opening for the possible passage of smoke to be detected and a smoke detection unit as disclosed above, which is arranged in the alarm housing and is screened against ambient light, wherein the photo-detector is arranged opposite the light-emitting diode for the detection of direct light, and wherein the control unit is arranged to emit a fire alarm if the sensor signal emitted by the photo-detector drops below a comparison value for a maximum admissible attenuation of light.

BRIEF DESCRIPTION OF THE DRAWINGS

Example aspects and embodiments of the invention are explained below with reference to the figures, in which.

DETAILED DESCRIPTION

Figure 1:
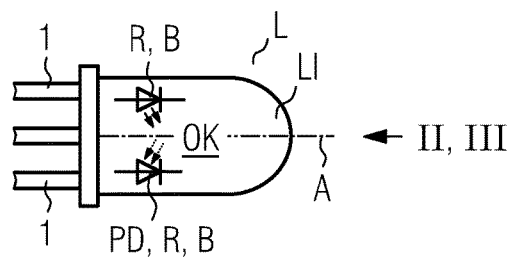
FIG. 1 shows an exemplary light-emitting diode for a smoke detection unit according to the invention with a first LED chip and with a second LED chip or with a photodiode for detecting a part of the light emitted from the second LED chip.

Embodiments of the invention may provide an optical smoke detection unit that operates reliably during standing and operating times.

Some embodiments provide an optical smoke detection unit for a danger alarm, e.g., for a smoke alarm, which includes a light-emitting LED having an LED housing with an LED chip arranged in the housing and connection contacts contacting the LED chip and running out of the LED housing; a photo-detector spectrally sensitive to emitted light for the detection of smoke; a control unit connected to the LED and to the photo-detector for the electrical control of the LED and for the evaluation of a sensor signal is emitted by the photo-detector for characteristic fire magnitudes. The LED may include a photosensor spectrally sensitive to the emitted light and arranged in the LED housing. The control unit may be arranged such that during the electrical control of LED the control unit simultaneously detects a characteristic electrical magnitude of the photosensor in order to derive aging information about the LED and to output the aging information and/or determine a reduction of the light current of the LED and to correct for such reduction by a modified electrical control of the LED.

Some embodiments provide a closed, an open, or an extinction smoke alarm including a smoke detection unit as disclosed above. Further, some embodiments utilize a two-color or multi-color LED.

As discussed above, the LED may comprise a photosensor which is spectrally sensitive to the emitted light. The control unit may be arranged in such a manner that the light-emitting diode can be controlled electrically, in particular pulsed and at the same time for detecting an electrical characteristic magnitude of the photosensor in order to derive and emit ageing information for the light-emitting diode. Alternatively or additionally, the control unit can be designed to determine the decrease of the light stream of the light-emitting diode from the detected characteristic magnitudes of the photosensor and to correct or compensate it by a changed electrical control of the light-emitting diode.

Therefore, the control unit may be configured to detect the light stream flowing through the photosensor as a measure for the emitted light current of the controlled light-emitting diode. Furthermore, the control unit may be configured to derive and output ageing information about the controlled light-emitting diode as a function of the degree of the decrease of the light stream and/or to modify the electrical control of the controlled light-emitting diode as a function of the above in order to correct a corresponding decrease of the emitted light current.

The photosensor is received in particular in the LED housing. It is in particular optically coupled to the LED chip or to the LED chips. As a result a part of the light emitted by the LED chip or from the LED chips arrives indirectly or directly such as, e.g. by scattering or reflection at the photosensor and can then be detected by the latter.

Instead of the light current a photo voltage generated by the light-emitting diode can be also be detected as an electrical characteristic magnitude. To this end an ohmic transimpedance resistor is connected parallel to the light-emitting diode and which converts the light current flowing through the light-emitting diode into a light voltage proportional to it. The light-emitting diode is disconnected here in its operation as a photodiode from the part of the circuit arrangement provided to this end (see FIG. 9), which is provided for the electrical control of the light-emitting diode for illumination.

The degree of the reduction of the light current can take place by determining the difference between a rated current value for the light current and a current actual current value of the light current. The rated current value can be determined, e.g. in the framework of a type- or series test of the optical smoke detection unit. It can also be an average value of measured current values at the beginning of the operating time of the smoke alarm. The rated current value determined in this manner can be stored, e.g., in a memory of the control unit, i.e. in a non-volatile memory of the microcontroller. The control unit can be designed to repeatedly and in particular cyclically detect a current actual current value of the light stream and to form by computer the difference from the storage rated current value and the currently detected actual current value of the light stream. This difference of the two current values then corresponds to the degree of the reduction of the light current.

The ageing information can be, e.g., a multi-stage degree of ageing or binary ageing information such as, e.g. "not aged" or "aged". The degree of ageing can be represented, e.g. by a numerical or a percentage value such as, e.g., from 0% to 100%. For example, a percentage value of 0 can represent the new state and a percentage value of 100 can represent the state in which a reliable detection of smoke is no longer possible on account of too little scattered light. The percentage values for the new state as well as for the state of the smoke detection which is no longer reliable can be determined by measuring technology, e.g., in the framework of a type testing of the smoke detection unit or of the smoke alarm. Percentage values located in between can be interpolated linearly. In the case of a given value such as, e.g., at 50% or 80% an appropriate warning message can then be emitted such as, e.g. via a connected alarm bus of the smoke alarm, via radio and/or acoustically or optically in the smoke alarm itself. The association between the detected light current of the photosensor to the exemplary percentage range of 0% to 100% can take place by a numerical table or a characteristic curve which are stored in an electronic memory of the microcontroller for subsequent evaluation of ageing by the microcontroller.

The control unit can be arranged to subsequently guide the emitted light current of the light-emitting diode controlled (for lighting) by an open or closed control circuit to a required rated light current for the smoke detection. The light current can be changed, e.g. by a lengthening of the pulse length in the electrical control of the light-emitting diode so that even the light energy per light pulse increases. Alternatively or additionally even the control current and therefore also the light current and the light performance of the light-emitting diode are increased. The current light current can be continuously determined in the sense of a closed control circuit and be subsequently guided by a change in the electrical control of the light-emitting diode.

The special advantage is the fact that the LED chip and the photosensor are not subjected to any contamination by the integration into a common LED housing. Therefore, no contaminating particles can pass into the optical coupling path by the direct optical coupling between the LED chip and the photosensor. Consequently, the photodetector always measures the current light current value and the current light performance of the LED chip during the operating time of the smoke detection unit. To this end a certain scattered light from the LED chip which occurs directly or via reflections on the LED housing on the photosensor is sufficient for a possible detection and evaluation by measuring technology.

As a result of the integration into the one-piece light-emitting diode no external photosensor is required anymore. The sensor signal emitted by the photosensor can be detected, e.g., by measuring technology by another connection contact run out of the LED housing. The photosensor can also already comprise an integrated measuring circuit and be arranged to modulate the supply current of the LED chip with the current signal corresponding to the currently measured light current value. The signal can then be detected by a measuring circuit outside of the light-emitting diode and evaluated. In this case another connection contact is not required.

According to an embodiment the photosensor is a photodiode spectrally sensitive to the emitted light of the LED chip, in particular a PIN photodiode.

According to an embodiment the light-emitting diode comprises two preferably type-identical LED chips such as, e.g. blue-illuminating or infrared-illuminating LED chips. (Only) a first one of the two LED chips is provided for emitting single-color light whereas (only) the second other LED chip is provided for the operation as photosensor. The control unit is arranged to control (only) the first LED chip electrically (for illumination) and to detect at the same time the light stream flowing through the second LED chip or a light voltage generated by the second LED chip in order to derive from them the ageing information of the first LED chip and to output it. The control unit can alternatively or additionally be set up to determine from the above the reduction of the light current of the first LED chip and to correct it by a modified electrical control of the first LED chip.

One aspect of the invention relates to the recognition that each light-emitting diode can also be operated as a photodiode even though with a significantly poorer degree of effectiveness in comparison to photodiodes which were specially developed for detection purposes. Nevertheless, the reflected light received by the particular other LED chip usually suffices for determining at least qualitatively the light current of the electrically controlled LED chip.

An advantage of this embodiment resides in the simple realizing of a monitored, one-color, light-emitting diode in that two structurally identical LED chips are applied in the framework of the manufacturing adjacent to one another on a common LED chip carrier and are then contacted by the connection contacts.

According to an alternative embodiment to the above the light-emitting diode is (at least) a two-color light-emitting diode. It can alternately also be a multi-color light-emitting diode such as, e.g. an RGB light-emitting diode. The two-color light-emitting diode preferably considered here comprises a first and a second LED chip for emitting light in a first wavelength range and in a second wavelength range different from the first one. The first LED chip can be constructed, e.g. for emitting light with a wavelength in the range of 665 nm to 100 nm, in particular for emitting light with a wavelength of 940 nm±40 nm or of 860 nm±40 nm. The second LED chip can be constructed, e.g. for emitting light with a wavelength in the range of 350 nm to 500 nm, in particular for emitting light with a wavelength of 460 nm±40 nm or 390 nm±40 nm. In sum, the first LED chip preferably emits light in the red/orange, red or infrared range and the second LED chip preferably emits light in the blue-green, blue, violet or ultraviolet range.

The LED chips are preferably constructed as surface radiators. The term "surface radiators" means here that the light is radiated from a level surface with a Lambert's light distribution. The surface radiators can therefore also be designated as Lambert radiators.

The control unit is arranged in this instance for controlling one of the LED chips electrically (for illumination) and switching the other LED chip into a method of operation as photodiode. This can also take place in an alternating manner for both LED chips. Furthermore, the control unit is arranged for detecting the light current flowing through the other LED chip or detecting a light voltage generated by the other LED chip as an electrical characteristic magnitude in order to derive the ageing information of the particular controlled LED chip from the above and to output it. The control unit can alternately or additionally be arranged to determine from the above the reduction of the light current of the particular controlled LED chip and to correct it by a modified electrical controlling of the particular controlled LED chip.

An improved smoke detection by a possible determination of the particle size of the smoke particles and therefore of the smoke type is possible by using two "LED colors".

At the same time, a mutual monitoring of the LED chips for an inadmissibly high ageing is advantageously possible.

As also in the previously cited case, the particular non-electrically controlled LED chip acts as a photodiode. The light sensitivity of an LED chip for received light becomes better the shorter its waves are in comparison to the wavelength of the light which the LED chip emits during electrical control. In other words, an infrared LED chip in the method of operation as a photodiode detects blue light distinctly better than a blue LED chip detects infrared light.

In the two previously cited exemplary embodiments the two LED chips are arranged adjacent to one another on a chip carrier of the light-emitting diode, wherein one edge of an LED chip lies opposite an edge of the other LED chip so that laterally emitted edge light of an LED is optically coupled laterally into the other LED chip.

The LED chips customarily stem from a wafer with a plurality of LED chips manufactured in an optoelectronic semiconductor process. Such a wafer is broken down by mechanical separation processes, in particular by sawing or breaking, into the plurality of LED chips. Such a "bare" component which is completely capable of functioning by itself is also designated as a "die". It therefore typically has a square or also rectangular shape. A light component which can hardly be evaluated is also emitted here via the lateral edges of such a LED chip. Precisely this component can now be advantageously used for monitoring ageing.

According to an advantageous embodiment the light-emitting diode is a two-color light-emitting diode. It again comprises, as initially described, a first and a second LED chip for emitting light in a first wavelength range and in a second wavelength range different from the first one. The photosensor is a photodiode, in particular a PIN photodiode, spectrally sensitive to the emitted light. The control unit is arranged to selectively control one of the LED chips electrically (for illumination) and at the same time to detect the light current flowing through the photodiode or to detect a light voltage generated by the photodiode as an electrical characteristic magnitude in order to derive the ageing information of the particular controlled LED chip from the above and to output it. Alternatively or additionally, the control unit is arranged to determine the reduction of the light current of the particular controlled LED chip and to correct it by a modified electrical control of the particular controlled LED chip.

The using of a photodiode spectrally sensitive to the emitted light of the two LED chips advantageously makes possible a very precise determination of the degree of ageing of the two LED chips as well as their correction and/or compensation.

Another advantage is the compact integration of the photodiode on the chip carrier together with the two adjacently arranged LED chips. As a result of the lack of any possibility of contamination an exact determination of the ageing of both LED chips is possible.

According to another embodiment the LED housing forms on its outer side such an optical boundary surface with the ambient air that a part of the light emitted from an LED chip is reflected to the photosensor respectively to the other LED chip. The photosensor is preferably a photodiode. The LED housing is manufactured from a transparent, preferably from a clear material such as, e.g., from a plastic or glass. "Transparent" denotes here that the plastic housing or glass housing is permeable at least for the emitted light stemming from the first and the second LED chip. Light beams emitted from the LED chip or from the LED chips are reflected on the outside of the LED housing for certain angle ranges given the presence of the boundary angle for the total reflection. This effect is also displayed in standard housings for light-emitting diodes which comprise a 3 mm diameter or a 5 mm diameter. These standard housings are manufactured in a plastic casting process in which an LED chip carrier with the LED chips applied on it, with the photosensor and with the connection contacts is also cast into the plastic housing. Such 3 mm or 5 mm light-emitting diodes are sold as is known "off the shelf" as a mass-produced consumer product. Light-emitting diodes with such a standard housing are typically provided for perforated assembly.

The LED housing can alternatively or additionally comprise such optical properties and/or optical structures that a part of the light emitted from an LED chip is reflected to the photosensor respectively to the other LED chip. The photosensor is preferably a photodiode. This can take place, e.g. by embedding reflecting scattering bodies in the LED housing. It can also be an area which is roughened on the otherwise smooth outer surface of the LED housing such as, e.g. by mechanical working or by etching on, so that this area acts as a scattering body or reflector.

According to an advantageous embodiment the smoke detection unit comprises a diaphragm arranged downstream of the light-emitting diode and/or a backscatter object downstream of the diaphragm so that a part of the emitted light is again reflected in the direction of the light-emitting diode in order to illuminate the particular LED chip. The diaphragm may be similar to an aperture ring of a camera, thus defining an opening through which emitted light of the LED may pass. The backscatter object may be located outside of the light-emitting diode. In the simplest case a part of the diaphragm surface located opposite the light-emitting diode can be constructed to be reflecting or shiny. In particular, this diaphragm surface is aligned in such a manner that the light of the light-emitting diode striking there is purposefully reflected back in the direction of the light-emitting diode.

The light-emitting diode can alternatively also be an SMD component for surface mounting on a circuit carrier.

Other embodiments provide a scattered light smoke alarm which comprises an alarm housing and an optical measuring chamber received in it with at least one opening for the possible passage of smoke to be detected. A smoke detection unit in accordance with the invention and screened against ambient light is received in the measuring chamber. The photo-detector is arranged with at least one light-emitting diode in a forward and/or backward scattered light arrangement. The control unit is arranged to indicate a fire alarm if the sensor signal emitted by the photo-detector exceeds a minimum scattered light level. In a forward scattered light arrangement the angle between the light-emitting diode and the photo-detector is in a range of 20° to 90°, in particular in a range of 30° to 70°. In a backward scattered light arrangement this angle is in a range of more than 90° to 160°, in particular in a range of 110° to 150°.

Other embodiments provide an open scattered light smoke alarm with the smoke detection unit according to the invention. The latter is arranged in or on an alarm housing of the open scattered light smoke alarm, wherein a detection chamber provided for the detection of scattered light is then located outside of the alarm housing. In other words, no other parts of the alarm housing are located between the light-emitting diode and the detection chamber located on the outside on the one hand and between the photo-detector and the detection chamber located on the outside. Aside from the above, a transparent covering can be present on the alarm housing for protection against contamination of the light-emitting diode and of the photo-detector. The control unit is arranged to emit a fire alarm if the sensor signal emitted by the photo-detector exceeds a minimum scattered light level.

Other embodiments provide an extinction smoke alarm which comprises an alarm housing with at least one opening for the possible passage of smoke to be detected and comprises a smoke detection unit according to the invention arranged in the alarm housing and screened against ambient light. The photo-detector is arranged opposite the light-emitting diode for the detection of direct light. The control unit is arranged for a emitting a fire alarm if the sensor signal emitted by the photo-detector drops below a comparison value for a maximum of admissible attenuation of light.

Finally, other embodiments provide a light-emitting diode, in particular by a multi-color light-emitting diode in which according to the invention a photodiode sensitive at least spectrally to the light emitted from particular LED chips of the light-emitting diode is arranged in the LED housing so that at least a part of the emitted light can be detected by the photodiode. The photodiode is contacted to the run-out connection contact or to at least one other connection contact and is constructed according to regulations for the detection of light and not for the emitting of light. The photodiode is in particular a PIN photodiode. The photodiode can also comprise an integrated electronic measuring amplifier circuit.

FIG. 1 shows an exemplary light-emitting diode L for a smoke detection unit according to the invention with a first LED chip R, B and with a second LED chip B, R or alternatively with a photodiode PD for detecting a part of the light emitted from the second LED chip B, R. The reference numeral R indicates that a red-or infrared-illuminating LED chip is preferably concerned while the reference numeral B indicates that a blue-illuminating LED chip is preferably concerned. OK denotes an optical coupling. This symbolically indicates that a part of the light emitted from the particular LED chip R, B reaches the particular other LED chip B, R or the photodiode PD in order to be able to be detected there. The connection contacts of the light-emitting diode L are designated with the reference symbol. The light-emitting diode L shown furthermore comprises a transparent LED housing which forms an optical lens LI for focusing the emitted light in the area of the light exit side. A designates the optical axis or the main axis of the light-emitting diode L along which the main propagation of the emitted light takes place.

Figure 2:
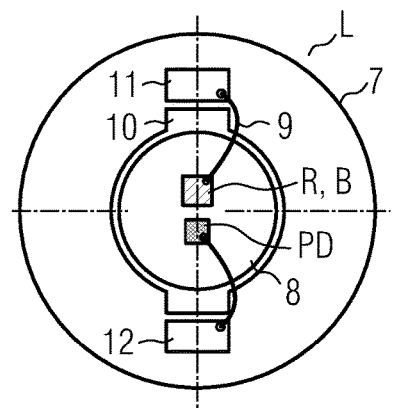
FIG. 2 shows a first embodiment with a single LED chip and with a photodiode according to the invention.

FIG. 2 shows a first embodiment with a single LED chip R, B and with a photodiode PD according to the invention along the viewing direction II shown in FIG. 1. The reference numeral 7 denotes an LED housing of transparent plastic, 8 denotes a chip carrier and 9 denotes bonding wires which contact the LED chip R, B to the connection contacts 1 run out of the LED housing 7 via corresponding contacting surfaces 10, 11, 12. 10 denotes a common connection contact surface for a common voltage potential and forms a common connection contact 1 toward the outside.

Figure 3:
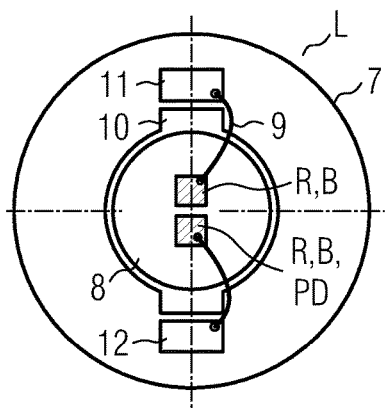
FIG. 3 shows a second embodiment with two LED chips.
Figure 9:
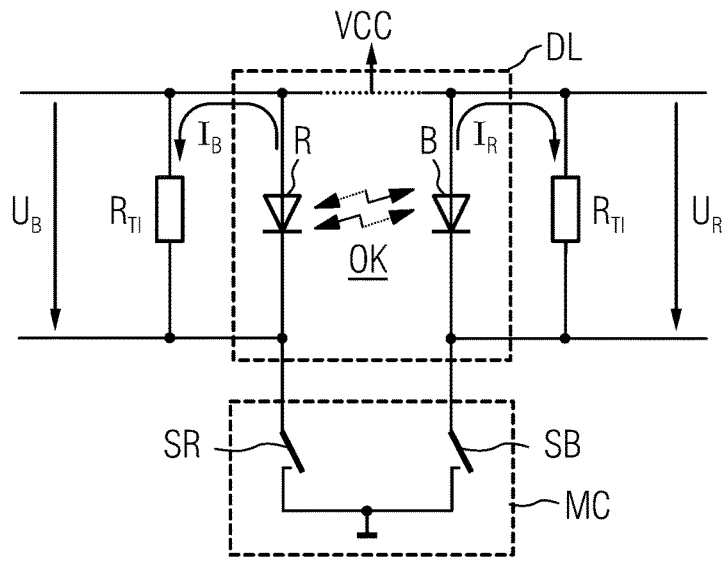
FIG. 9 shows an exemplary circuit arrangement for the alternating control and for the alternating evaluation of two LED chips by a transimpedance converter according to the invention.

FIG. 3 shows a second embodiment with two LED chips R, B along the viewing direction III shown in FIG. 1. According to the invention the two LED chips R, B are identical-type optoelectronic components which typically stem from the same lot. A first one of the two LED chips R, B is provided according to regulations for emitting one-color light while the other, second LED chip R, B is provided for operating as a photodiode. To this end a control unit connected to the two LED chips R, B is arranged to electrically control (only) the first LED chip R, B and to detect at the same time the light current flowing through the second LED chip R, B or a light voltage generated by the second LED chip R, B in order to derive from it the ageing information of the first LED chip R, B and to emit it. Alternatively or additionally, the control unit is arranged for determining from the above the reduction of the light current of the first LED chip R, B and to correct it by a modified electrical controlling of the first LED chip R, B. A circuit arrangement suitable to this end is shown in the example of FIG. 9.

Figure 4:
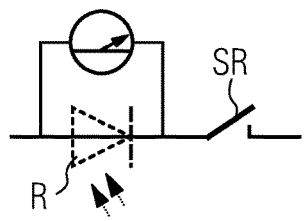
FIG. 4 shows the alternating control in accordance with the invention of two LED chips and an evaluation using measuring technology in a symbolic representation.
Figure 4:
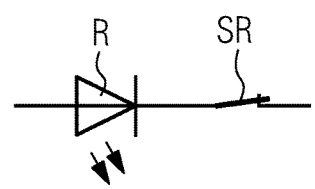
Figure 4:
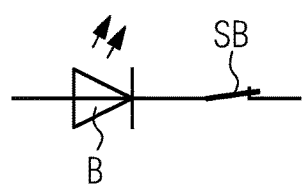
Figure 4:
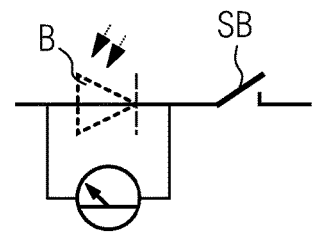

FIG. 4 shows the alternating control in accordance with the invention of two LED chips R, B of the light-emitting diode as well as the evaluation using measuring technology in a symbolic representation. In the left part of the figure the "blue" LED chip B is symbolized by a closed switch SB electrically controlled for emitting blue light whereas the "red" LED chip R, symbolized by an open switch SR and by a measuring device for detecting an electrical characteristic magnitudes of the "red" LED chip R, is connected into an operation as photodiode and detects a part of the blue light by the optical coupling OK. In the right part of the figure the "red" LED chip R is electrically controlled for emitting red light while the "blue" LED chip B is connected into an operation as photodiode and detects a part of the red light by the optical coupling OK. The detection of blue light by the "red" LED chip R is more efficient than the detection of red light by the blue LED chip B. This is symbolized in FIG. 4 by the smaller indicator deflection for the blue LED chip B compared to the indicator deflection for the red LED chip R.

Figure 5:
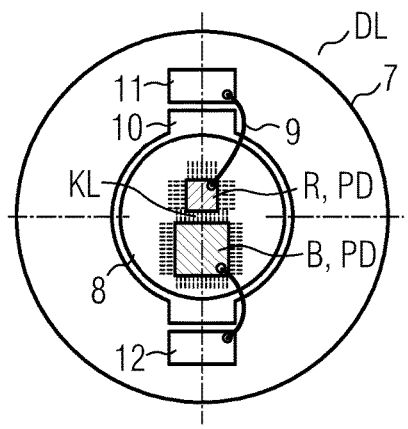
FIG. 5 shows another embodiment with two adjacently arranged LED chips for the emission and detection of emitted edge light according to the invention.

FIG. 5 shows another embodiment with two adjacently arranged LED chips R, B for the emission and detection of emitted edge light KL according to the invention. As FIG. 5 shows, two edges of the two LED chips R, B lie opposite one another so that emitted edge light KL can couple in directly laterally in the particular opposite LED chip R, B. In the embodiment shown the "blue" LED chip B has in comparison to the "red" LED chip R a greater optically active surface of more than the factor 2.5. "Optically active" denotes the parts of the surface of the LED chips which emit light upon excitation by current. Areas for the contacting of the LED chips on the surface which are determined, e.g. for contacting a bonding wire therefore do not belong to them. As a result of the greater optically active surface of the "blue" LED chip B, the poorer electrooptical degree of efficiency in the production of light can be at least partially compensated.

Figure 6:
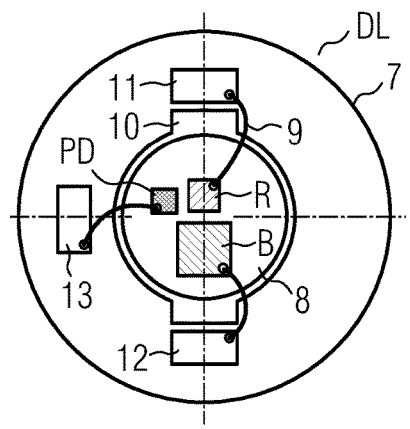
FIG. 6 shows another embodiment with two LED chips and a photodiode for detecting a part of the light emitted from the LED chips according to the invention.

FIG. 6 shows another embodiment with two LED chips R, B and a photodiode PD for the detection of a part of the light emitted by the LED chips R, B according to the invention. Therefore, the light-emitting diode is a two-color light-emitting diode L. The photodiode PD is spectrally sensitive to the emitted, two-color light. The photodiode PD is a PIN photodiode such as, e.g., a silicon PIN photodiode and preferably a silicon PIN photodiode with improved sensitivity to blue. Both LED chips R, B and the photodiode PD constructed as a chip and present as a "die" are arranged adjacent to one another on the chip carrier 8.

Figure 7:
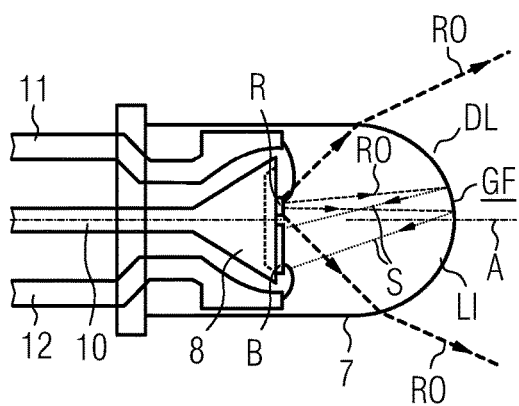
FIG. 7 shows an example for the propagation of light and reflection, FIG. 8 in an LED housing with blue and red light, for example, as well as its detection by the particular other LED chip according to the invention.
Figure 8:
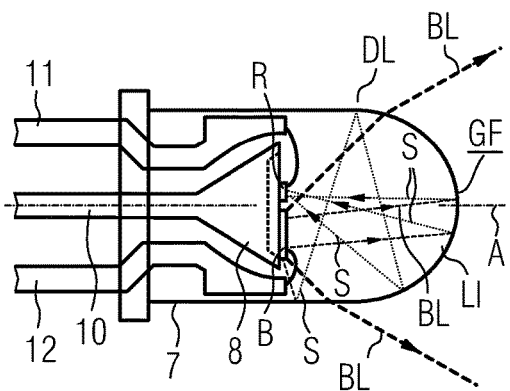

FIGS. 7 and 8 show an example for the propagation and reflection of light in an LED housing 7 with, for example, red and blue light RO, BL as well as its detection by the particular other LED chip R, B according to the invention. In FIG. 7 the "red" LED chip R is controlled for emitting red light. The emitting red light beams RO are focused by the optical lens LI constructed in the LED housing 7. However, part of the RO light beams is reflected on the boundary surface GF to the outer ambient air and passes as scattered light, among other things, also to the "blue" LED chip B. Light from the "red" LED chip R can be detected by the "blue" LED chip B with this optical coupling. FIG. 8 analogously shows the case of the emitting of blue light and the detection of a part of the reflected blue light beams BL by the "red" LED chip R.

FIG. 9 shows an exemplary circuit arrangement for the alternate control and for the alternate evaluation of two LED chips R, B by a transimpedance converter $R_{TT}$ according to the invention. A control unit MC constructed as a microcontroller is shown in the lower part of FIG. 9 and is programmed to alternately open and close the two switches SR, SB. The two switches SR, SB are usually switching transistors. They are already integrated in the microcontroller MC in the present example. The two LED chips R, B are alternately switched with the two switches SR, SB in order to emit light to a supply voltage VCC. An ohmic resistor R $R_{TT}$ connected parallel to an LED chip R, B is provided for converting a particular generated light current $I_B$, $I_R$ in the "photodiode" operating type into a corresponding light voltage $U_B$, $U_R$. The ohmic value of the two resistors $R_{TT}$ is a multiple greater than the inner resistance of the LED chips R, B in the forward direction. The light voltages $U_B$, $U_R$ now present can be especially readily detected by an A/D converter and evaluated by the microcontroller MC. The A/D converters can also be integrated in the microcontroller MC.

Figure 10:
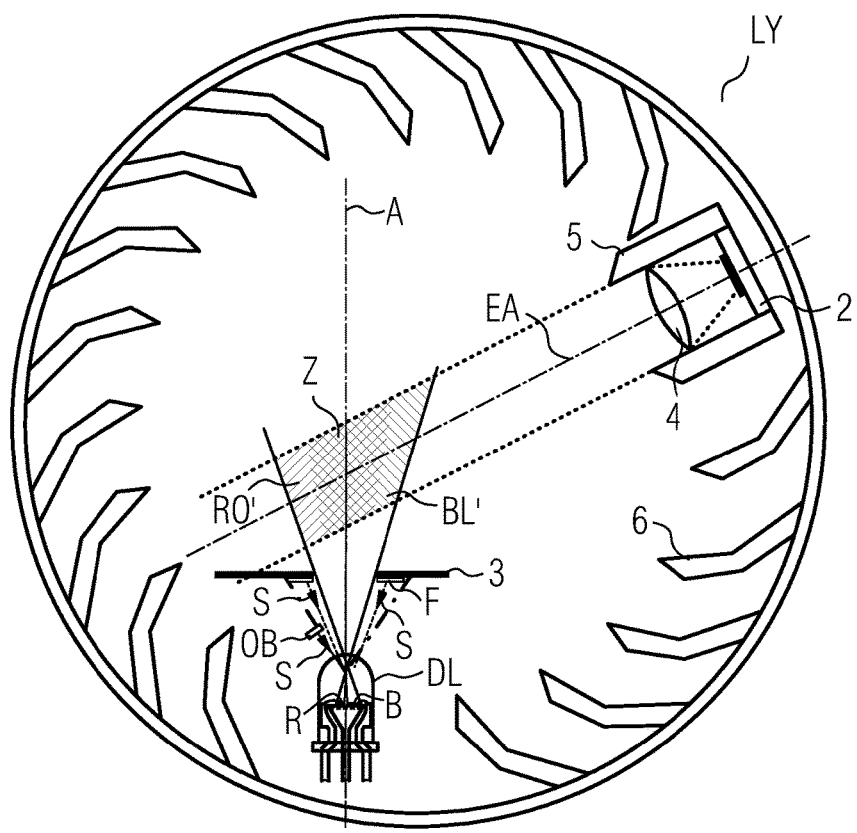
FIG. 10 shows an example for a smoke detection unit according to the invention for a scattered light smoke alarm with a two-color LED and with a photo-detector in a forward scattered light arrangement.

In conclusion, FIG. 10 shows an example for a smoke detection unit according to the invention for a scattered-light smoke alarm. The alarm comprises a two-color light-emitting diode DL and a photo-detector 2 with lens 4 connected in front in a forward scattered light arrangement. LY denotes an optical measuring chamber which is permeable for smoke to be detected and is screened against direct ambient light. This is achieved by a suitable arrangement of the lamellas 6 of the measuring chamber LY. A is the optical axis of the light-emitting diode DL and EA designates the optical receiving axis of the photo-detector 2. Both axes A, EA form, for example, a forward scattered light angle of approximately 60°. Z designates a scattered light center. A part of the scattered light from particles to be detected which are illuminated by the light-emitting diode DL in this scattered light range or scattered light volume Z finally pass to the photo-detector 2. In order to avoid that direct light from the light-emitting diode DL reaches the photo-detector 2, additional diaphragms 3, 5 are provided. RO' and BL' designate emitted light bundles which pass the diaphragm 3 of the light-emitting diode DL. According to the invention a backscatter object OB can be attached between the light-emitting diode DL and the diaphragm 3 or a reflecting layer F can be applied on the diaphragm so that a part of the emitted light bundle RO, BL is reflected back in the direction of the light-emitting diode DL. A part of this scattered light S then passes to the particular, non-controlled LED chip R, B. A light voltage generated on this LED chip R, B can then be detected by the connection contacts 1 of the light-emitting diode DL and be evaluated.

LIST OF REFERENCE NUMERALS

1, 10-13 connection contacts
2 photosensor, photodiode, silicon PIN photodiode
3 diaphragm, hole diaphragm
4 photo-detector lens
5 photo-detector diaphragm
6 lamella, light screening element
7 housing, LED housing, light-emitting diode housing
8 LED chip carrier, carrier, carrier plate
9 bonding wires
A optical axis, optical transmitting axis
B blue LED chip
BL blue light bundle
BL' passing blue light bundle
DL two-color light-emitting diode, DUAL LED
EA optical axis, optical receiving axis
F reflecting layer, color layer
GF optical boundary surface
$I_R$, $I_B$ light current
KL edge light
L light-emitting diode, LED
LI optical lens
LY optical measuring chamber, labyrinth
MC control unit, microcontroller
OB backscatter object
OK optical coupling
PD photosensor chip, photodiode
R red LED chip
RO red light bundle
RO' passing red light bundle
$R_{TI}$ resistor, transimpedance converter
S backscattered light
SR, SB controllable switch, transistor
$U_R$, $U_B$ light voltage
VCC supply voltage
Z scattered light center, measured volume

What is claimed is:

1. An optical smoke detection unit for a danger alarm, the optical smoke detection unit comprising:
    a light-emitting diode (LED) for emitting light, wherein the LED comprises:
        an LED housing ;
        an LED chip arranged in the LED housing;
        a photosensor arranged in the LED housing and spectrally sensitive to emitted light; and
        connection contacts contacting the LED chip and running out of the LED housing,
    a photo-detector spectrally sensitive to emitted light for the detection of smoke,
    a control unit connected to the LED and to the photo-detector and configured to:
        provide electrical control of the LED;
    evaluate a sensor signal emitted by the photo-detector for characteristic fire magnitudes,
        during electrical control of the LED, detect a characteristic electrical magnitude of the photosensor; and
        based on the detected characteristic electrical magnitude of the photosensor, at least one of:
            (a) determine and output ageing information about the LED based on the detected characteristic electrical magnitude of the photosensor, or
            (b) determine a reduction of light current of the LED and correct for the determined reduction of light current by performing a modified electrical control of the LED.

2. The smoke detection unit according to claim 1, wherein the photosensor is a PIN photodiode spectrally sensitive to the emitted light.

3. The smoke detection unit according to claim 1, wherein the photosensor comprises an integrated, electronic measurement amplification circuit.

4. The smoke detection unit according to claim 1, wherein:
    the LED comprises two type-identical LED chips, wherein a first one of the two LED chips is operated to emit a one-color light while the other, second LED chip is operated as a photodiode,
    the control unit is configured to electrically control the first LED chip and at the same time either detect a light stream flowing through the second LED chip or detect a light voltage generated by the second LED chip to (a) derive and output the ageing information of the first LED chip and/or (b) determine a reduction of the light current of the first LED chip and perform a modified electrical control of the first LED chip.

5. The smoke detection unit according to claim 1, wherein:
    the LED is a two-color LED comprising a first LED chip configured to emit light in a first wavelength range and a second LED chip configured to emit light in a second wavelength range different from the first wavelength range,
    the control unit is configured to:
        electrically control the first LED chip and to switch the second LED chip into an photodiode operating mode, and
        detect the light current flowing through the second LED chip or a light voltage generated by the second LED chip as a characteristic electrical magnitude to (a) derive and output the ageing information of the particular controlled LED chip and/or (B) determine a reduction of the light current of the first LED chip and provide a modified electrical control of the first LED chip to correct for such reduction of light current.

6. The smoke detection unit according to claim 4, wherein the two LED chips are arranged adjacent to one another on a chip carrier of the LED,
    wherein one edge of one LED chip is located opposite an edge of the other LED chip such that laterally emitted edge light of the one LED chip is coupled optically laterally into the other LED chip.

7. The smoke detection unit according to claim 1, wherein:
    the LED is a two-color LED comprising a first LED chip configured to emit light in a first wavelength range and a second LED chip configured to emit light in a second wavelength range different from the first wavelength range,
    the photosensor is a PIN photodiode spectrally sensitive to the emitted light, and
    the control unit is configured to:
        selectively control the first LED chip electrically and at the same time to detect a light stream flowing through the photodiode or a light voltage generated on the photodiode as a characteristic electrical magnitude to (a) derive and output the ageing information of the first LED chip and/or (b) determine the reduction of the light current of the first LED chip and to perform a modified electrical control of the first LED chip to correct for such reduction of light current.

8. The smoke detection unit according to claim 1, wherein:
the LED comprises a first LED chip and a second LED chip, and
the LED housing forms an optical boundary surface for ambient air such that a part of the light emitted from the first LED chip is reflected to a photosensor of the second LED chip.

9. The smoke detection unit according to claim 1, wherein:
the LED comprises a first LED chip and a second LED chip,
the LED housing is formed from a plastic transparent for the emitted light, and
the LED housing has optical properties and/or optical structures configured to reflect a part of the light emitted from the first LED chip to a respective photosensor of the second LED chip.

10. The smoke detection unit according to claim 1, wherein the smoke detection unit comprises at least one of the following elements arranged downstream of the LED:
an optical diaphragm having an aperture allowing light to pass through, or
a backscatter object configured to reflect a part of the emitted light back in the direction of the LED in order to illuminate the particular LED chip.

11. The smoke detection unit according to claim 1, wherein:
the LED comprises a first LED chip and a second LED chip, and
at least one of the LED chips is configured to emit light with a wavelength in at least one of the following wavelength ranges: (a) 665 nm to 1000 or (b) 350 nm to 500 nm.

12. The smoke detection unit according to claim 1, wherein the LED has a standard plastic housing with a 3 mm or 5 mm diameter, or wherein the LED is an SMD component for surface mounting on a circuit carrier.

13. A scattered light smoke alarm comprising:
an alarm housing, and
an optical measuring chamber defined in the alarm housing, the optical measuring chamber having at least one opening for receiving smoke to be detected,
a smoke detection unit received in the measuring chamber and screened against ambient light, the smoke detection unit comprising:
a light-emitting diode (LED) for emitting light, the LED comprising:
an LED housing;
an LED chip arranged in the LED housing;
a photosensor arranged in the LED housing and spectrally sensitive to emitted light; and
connection contacts contacting the LED chip and running out of the LED housing,
a photo-detector spectrally sensitive to emitted light for the detection of smoke,
a control unit connected to the LED and to the photo-detector and configured to:
provide electrical control of the LED;
evaluate a sensor signal emitted by the photo-detector for characteristic fire magnitudes,
during electrical control of the LED, detect a characteristic electrical magnitude of the photosensor; and
based on the detected characteristic electrical magnitude of the photosensor, at least one of:
(a) determine and output ageing information about the LED based on the detected characteristic electrical magnitude of the photosensor, or
(b) determine a reduction of light current of the LED and correct for the determined reduction of light current by performing a modified electrical control of the LED,
wherein the photo-detector is arranged relative to the LED in at least one of a forward or a backscatter light arrangement, and
wherein the control unit is further configured to emit a fire alarm if the signal emitted by the photo-detector exceeds a minimum scattered light level.

14. An open scattered light smoke alarm, comprising:
an alarm housing;
a detection chamber located outside of the alarm housing, the detection chamber being configured for detection of scattered light, and
a smoke detection unit arranged in the alarm housing of the open scattered light smoke alarm, the smoke detection unit comprising:
a light-emitting diode (LED) for emitting light, the LED comprising:
an LED housing ;
an LED chip arranged in the LED housing;
a photosensor arranged in the LED housing and spectrally sensitive to emitted light; and
connection contacts contacting the LED chip and running out of the LED housing,
a photo-detector spectrally sensitive to emitted light for the detection of smoke, and configured to emit a sensor signal,
a control unit connected to the LED and to the photo-detector and configured to:
evaluate the sensor signal emitted by the photo-detector for characteristic fire magnitudes;
emit a fire alarm if the sensor signal emitted by the photo-detector exceeds a minimum scattered light level;
provide electrical control of the LED;
during electrical control of the LED, detect a characteristic electrical magnitude of the photosensor; and
based on the detected characteristic electrical magnitude of the photosensor, at least one of:
(a) determine and output ageing information about the LED based on the detected characteristic electrical magnitude of the photosensor, or
(b) determine a reduction of light current of the LED and correct for the determined reduction of light current by performing a modified electrical control of the LED.

15. An extinction smoke alarm, comprising:
an alarm housing having at least one opening for receiving smoke to be detected; and
a smoke detection unit arranged in the alarm housing and screened against ambient light, the smoke detection unit comprising:
a light-emitting diode (LED) for emitting light, the LED comprising:
an LED housing ;
an LED chip arranged in the LED housing;

a photosensor arranged in the LED housing and spectrally sensitive to emitted light; and connection contacts contacting the LED chip and running out of the LED housing, a photo-detector spectrally sensitive to emitted light for the detection of smoke, and configured to emit a sensor signal, a control unit connected to the LED and to the photo-detector and configured to:

evaluate the sensor signal emitted by the photo-detector for characteristic fire magnitudes;

emit a fire alarm if the sensor signal emitted by the photo-detector drops below a comparison value for a maximum admissible attenuation of light;

provide electrical control of the LED;

during electrical control of the LED, detect a characteristic electrical magnitude of the photosensor; and based on the detected characteristic electrical magnitude of the photosensor, at least one of:

(a) determine and output ageing information about the LED based on the detected characteristic electrical magnitude of the photosensor, or (b) determine a reduction of light current of the LED and correct for the determined reduction of light current by performing a modified electrical control of the LED.

\* \* \* \* \*